US006709965B1

United States Patent
Chen et al.

(10) Patent No.: US 6,709,965 B1
(45) Date of Patent: Mar. 23, 2004

(54) ALUMINUM-COPPER BOND PAD DESIGN AND METHOD OF FABRICATION

(75) Inventors: Kuo-Chou Chen, Tainan (TW); Huai-Jen Hsu, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/262,923

(22) Filed: Oct. 2, 2002

(51) Int. Cl.$^7$ .................. H01L 21/44; H01L 21/4763; H01L 21/302; H01L 21/61; H01L 21/26
(52) U.S. Cl. .............. 438/612; 438/640; 438/739; 438/792
(58) Field of Search ................ 438/612, 634, 438/640, 712, 739, 756, 788, 792; 257/774, 784

(56) References Cited

U.S. PATENT DOCUMENTS

| | | | | |
|---|---|---|---|---|
| 4,827,326 A | * | 5/1989 | Altman et al. | 257/759 |
| 5,552,343 A | * | 9/1996 | Hsu | 438/586 |
| 5,731,243 A | | 3/1998 | Peng et al. | 438/612 |
| 6,261,704 B1 | | 7/2001 | Paranthaman et al. | 428/637 |
| 6,287,950 B1 | | 9/2001 | Wu et al. | 438/612 |
| 6,303,459 B1 | | 10/2001 | Chen | 438/401 |
| 6,361,704 B1 | | 3/2002 | Shih et al. | 216/38 |

OTHER PUBLICATIONS

Stanley Wolf Ph.D. and Richard N. Tauber Ph.D. in Silicon Processing for the VLSI Era, vol. 1: Process Technology, Lattice Press, 1986, pp. 191–195, 531–534, 539–542, 581.*

* cited by examiner

Primary Examiner—W. David Coleman
Assistant Examiner—William M. Brewster
(74) Attorney, Agent, or Firm—George O. Saile; Stephen B. Ackerman

(57) ABSTRACT

A process for forming a bond pad structure to be used to accommodate a subsequent wire bond, has been developed. The process features defining a bond pad opening in a composite insulator stack, exposing a portion of a top surface of an upper level metal interconnect structure at the bottom of the bond pad opening. The bond pad opening is formed with a top portion of the composite insulator stack laterally pulled back from a bottom portion of the same composite insulator stack. The bond pad structure, comprised of aluminum—copper, is then formed entirely in the bond pad opening, with the top surface of the bond pad structure lower than the top surface of the composite insulator stack, thus resulting in a bond pad structure topography offering reduced risk of damage during subsequent pre-wire bonding procedures.

30 Claims, 3 Drawing Sheets

ALUMINUM-COPPER BOND PAD DESIGN AND METHOD OF FABRICATION

BACKGROUND OF THE INVENTION

1. Field of the Invention

The present invention relates to methods used to fabricate semiconductor devices, and more specifically to a novel bond pad structure employed to accommodate a subsequent wire bond design, and the method of forming the novel bond pad structure.

2. Description of Prior Art

Wire bonds have been used to connect a specific semiconductor chip to an external component such as a module or package. A wire bond, comprised of gold wire is first bonded to a specific region of the semiconductor chip with the other end of the wire then connecting to the external component. The conductive region of the semiconductor chip used to accommodate the gold wire bond is a conductive bond pad structure which communicates with the active device regions of a semiconductor substrate via multiple levels of metal interconnect structures. A critical aspect of the wire bond procedure is the integrity of the conductive bond pad structure to which the wire will be connected to. Bond pad structures comprised of conductive materials such as aluminum based layers, have to survive several processes prior to the wire bond procedure. For example the semiconductor wafer comprised with numerous semiconductor chips has to be thinned to approximately to a thickness of about 15 mils via a backside grounding procedure, prior to dicing or separation of the individual semiconductor chips. This procedure can damage a bond pad structure, specifically if a raised topography of the bond pad structure is exposed during the wafer thinning procedure. In addition an unprotected bond pad structure can be damaged in terms of scratches and defects during transporting of the pre-diced semiconductor wafer to an another area of a semiconductor facility in which dicing and wire bonding functions will be performed. Damaged bond pad structure can adversely influence the quality of a gold wire bond in terms of increased resistance at the wire bond—bond pad structure interface, which in turn deleteriously influence the reliability and yield of a package comprised with individually wire bonded semiconductor chips.

This invention will describe a novel bond pad structure design, and a process sequence used for fabrication of the novel bond pad structure, in which the top surface of the bond pad structure is maintained below the top surface of the dielectric layer in which the bond pad opening was defined in. This novel topographical situation offers protection to the bond pad structure during subsequent pre-dicing procedures such as wafer thinning and transportation. Prior art such as Wu et al, in U.S. Pat. No. 6,287,950, Paranthaman et al, in U.S. Pat. No. 6,261,704 B1, Peng et al, in U.S. Pat. No. 5,731,243, and Shih et al, in U.S. Pat. No. 6,361,704 B1, and Chen, in U.S. Pat. No. 6,303,459 B1, describe bonding pad structures and methods of forming these bond pad structures. None of the prior art however describe the present invention in which a bonding pad opening is isotropically and anisotropically defined to enable the top surface of a subsequently formed bond pad structure to be located entirely in the bond pad opening, featuring a top surface below the top surface of the dielectric layers in which the bond pad opening was defined in.

SUMMARY OF THE INVENTION

It is an object of this invention to form a bond pad structure on an exposed portion of an underlying metal interconnect structure of a semiconductor substrate to accommodate a subsequent wire bond, which in turn is used to physically connect a semiconductor chip to an external package.

It is another object of this invention to define a bond pad opening in a composite insulator stack with the top insulator layer of the composite insulator stack defined isotropically and laterally pulled back from the underlying insulator layers of the composite insulator stack, which are opened anisotropically.

It is still another object of this invention to form the bond pad structure entirely in the bond pad opening in the composite insulator stack, with the top surface of the bond pad structure located below the top surface of the composite insulator stack.

In accordance with the present invention a bond pad structure design, and the method of forming the bond pad structure, featuring a bond pad opening formed isotropically and anisotropically in a composite insulator stack, and featuring formation of the bond pad structure located entirely in the bond pad opening, is described. After formation of an upper level metal interconnect structure a composite insulator stack comprised of an underlying silicon oxide layer, a silicon nitride layer, and an overlying, thick silicon oxide layer, is deposited. Definition of a bond pad opening in the composite insulator stack is next accomplished via a selective isotropic etch of the thick silicon oxide layer, laterally undercutting the overlying defining photoresist shape. Anisotropic dry etching of the silicon nitride layer and of the underlying silicon oxide layer result in a bond pad opening exposing a portion of the top surface of the upper level metal interconnect structure, with the bond pad opening featuring an isotropic opening in the thick silicon oxide component, laterally pulled back from the underlying silicon nitride layer. Deposition of a metal layer, thinner than the thick silicon oxide layer, is followed by patterning of the metal layer resulting in the definition of a bond pad structure located entirely in the bond pad opening, with the top surface of the bond pad structure lower than the top surface of the composite insulator stack.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

Figure 1:
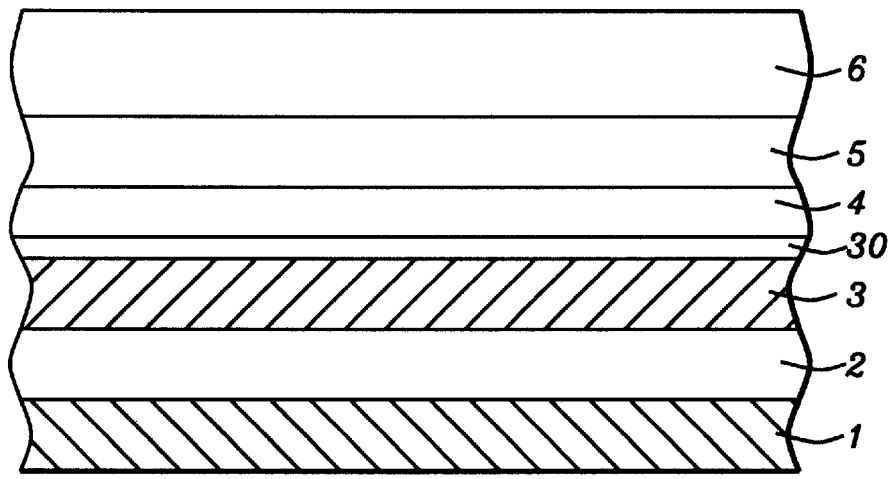
FIGS. 1–6, which schematically in cross-sectional style show the novel bond pad structure, and key stages used to fabricate the novel bond pad structure.

The novel bond pad structure, and the method of forming the novel bond pad structure in which the top surface of the bond pad structure, located entirely in a bond pad opening in a composite insulator stack, is lower than the top surface of the composite insulator stack, will now be described in detail. The metal interconnect structures and intermetal dielectric layers, employed prior to formation of a bond pad structure, are schematically shown in FIG. 1. Metal interconnect structure 1, comprised of a metal such as copper, is first defined either directly contact underlying active device regions in a semiconductor substrate, or in contact with lower level metal interconnect structures which in turn contact and communicate with the active device regions in a semiconductor substrate. Metal interconnect structure 1, can be defined via initial deposition of a copper layer using plasma vapor deposition (PVD), or copper plating procedures, followed by a copper chemical mechanical polishing (CMP), procedure. After formation of metal interconnect structure 1, intermetal dielectric (IMD), layer 2, a layer such as silicon oxide, phosphosilicate glass (PSG), or boro-phosphosilicate glass (BPSG), is deposited via plasma enhanced chemical vapor deposition (PECVD), procedures. Upper level metal interconnect structure 3, is next formed on IMD layer 2, again via deposition of a copper layer via PVD or copper plating procedures, followed by a copper CMP procedure. Not shown in the drawings is a metal plug structure formed in a via opening in IMD layer 2, prior to formation of upper level metal interconnect structure 3, used to allow contact and communication between metal interconnect structure 1, and upper level metal interconnect structure 3. The result of these procedures is schematically shown in FIG. 1.

After definition of upper metal interconnect structure 3, thin silicon nitride layer 30, is deposited via PECVD procedures to a thickness between about 500 to 1500 Angstroms, used to enclose upper level metal interconnect structure 3. Silicon oxide layer 4, is next deposited at a thickness between about 3000 to 5000 Angstroms, via PECVD or low pressure chemical vapor deposition (LPCVD), procedures. Silicon nitride layer 5, is next deposited via PECVD or LPCVD procedures at a thickness between about 6000 to 8000 Angstroms, followed by deposition of overlying silicon oxide layer 6, at a thickness between about 13,000 to 15,000 Angstroms, again employing PECVD or LPCVD procedures, using tetraethylorthosilicate (TEOS), as a source. The composite insulator stack comprised of overlying silicon oxide layer 6, silicon nitride layer 5, and underlying silicon oxide layer 4, and thin silicon nitride layer 20, on upper level metal interconnect structure 3, is schematically shown in FIG. 1.

Figure 2:
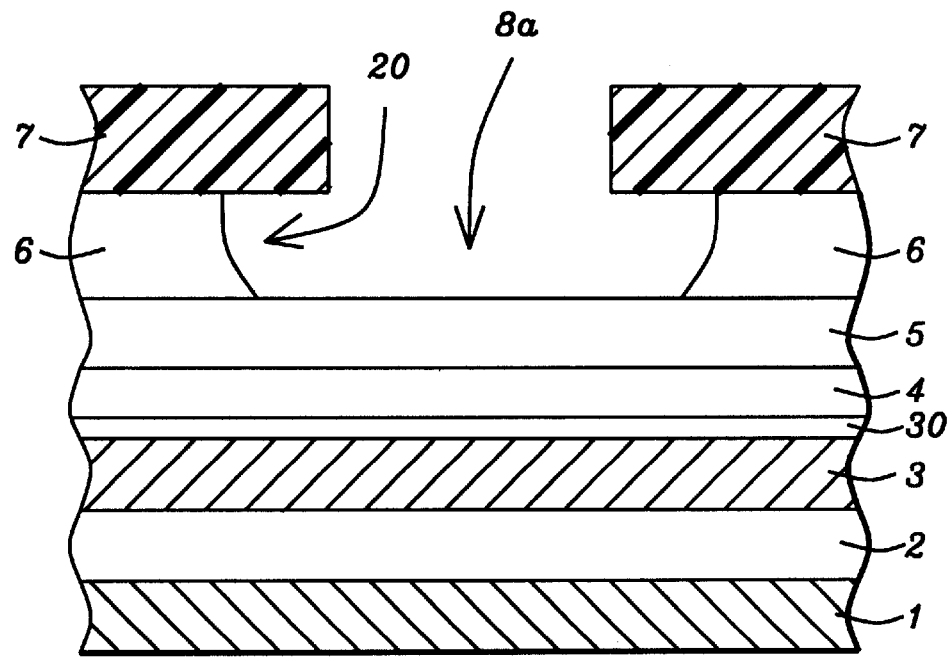

To satisfy the objective of defining a bond pad structure entirely in a bond pad opening in a composite insulator stack, as well as forming the bond pad structure with a top surface lower than the top surface of the composite dielectric stack, a bond pad opening featuring an isotropically defined thick silicon oxide layer, and anisotropically defined underlying layers of the composite insulator stack is formed. Photoresist shape 7, is defined and used as an etch mask to allow selective, isotropic etching of thick silicon oxide layer 6, to be accomplished resulting in isotropic opening 8a, in thick silicon oxide layer 6. The isotropic etching of thick silicon oxide layer 6, is performed via wet etch procedures, using either a buffered or dilute hydrofluoric acid solution as a selective etchant for silicon oxide, resulting in opening 8a, shown schematically in FIG. 2. The level of lateral undercut 20, in opening 8a, is between about 12,000 to 14,000 Angstroms. If desired the isotropic etching of thick silicon oxide layer 6, can be accomplished via a selective dry etch procedure using $CHF_3$, as an etchant for silicon oxide, performed at a pressure which allows lateral undercut 20, in silicon oxide layer 6, to again be obtained.

Figure 3:
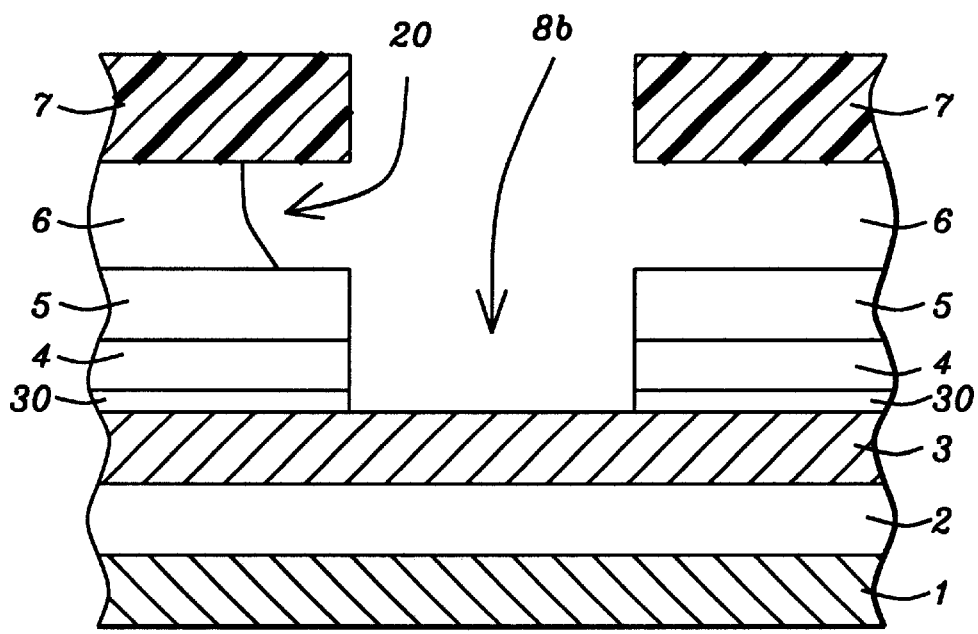

With photoresist shape 7, still in place an anisotropic reactive ion etch (RIE), procedure is employed to remove exposed portions of silicon nitride layer 5, of underlying silicon oxide layer 4, and of thin silicon nitride layer 30, resulting in bond pad opening 8b, comprised of the laterally recessed, isotropic opening in silicon oxide layer 6, and the anisotropic openings in silicon nitride layer 5, silicon oxide layer 4, and thin silicon nitride layer 30, exposing a portion of the top surface of upper level metal interconnect structure 3. This is schematically shown in FIG. 3. The anisotropic RIE procedure is performed using $CF_4$ or $SF_6$ as a selective etchant for the silicon nitride layers, while $CHF_3$ is used as a selective etchant for silicon oxide layer 4, with the RIE procedure selectively terminating at the appearance of upper level metal interconnect structure 3.

Figure 4:
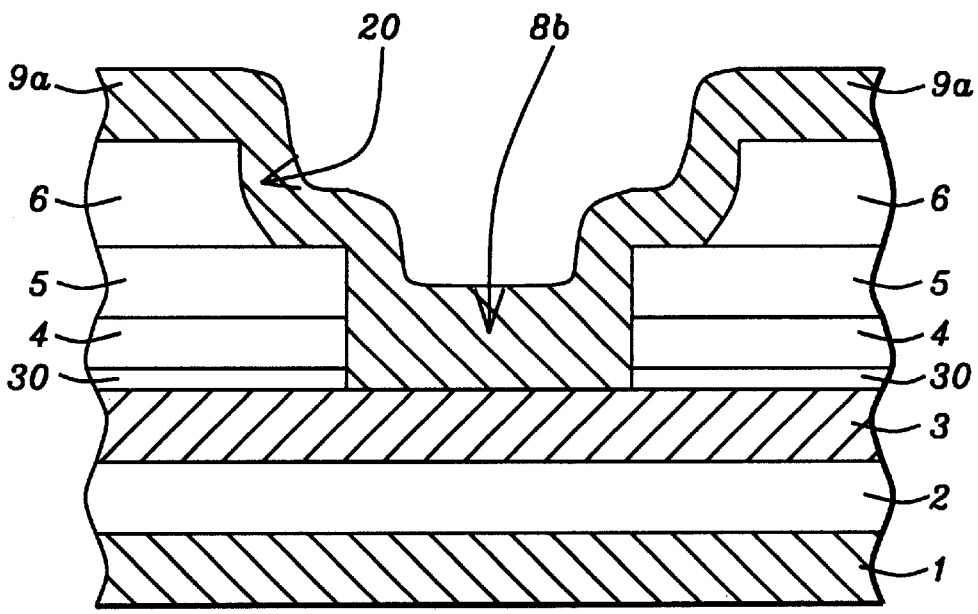

Removal of photoresist shape 7, is accomplished via plasma oxygen ashing procedures, followed by a post clean procedure used to remove native oxide from the exposed surface of upper level metal interconnect structure 3. Metal layer 9a, comprised of an aluminum based layer such as aluminum, or aluminum—copper (AlCu), is next deposited via plasma vapor deposition (PVD), or RF sputtering procedures, to a thickness between about 10,000 to 12,000 Angstroms, completely filling bond pad opening 8b. The weight percent of copper, in metal layer, or in aluminum—copper layer 9a, is between about 0 to 2. The metal deposition conditions result in excellent coverage allowing equal thicknesses of the metal layer to be realized on all surfaces, including on the surface of silicon nitride layer 5, exposed as a result of lateral undercut region 20, in silicon oxide layer 6. To insure the top surface of a subsequent bond pad structure features a top surface lower than the top surface of the composite insulator stack, metal layer 9a, is deposited at a thickness less than the thickness of thick silicon oxide layer 6. The result of the metal deposition procedure is schematically shown in FIG. 4.

Figure 5:
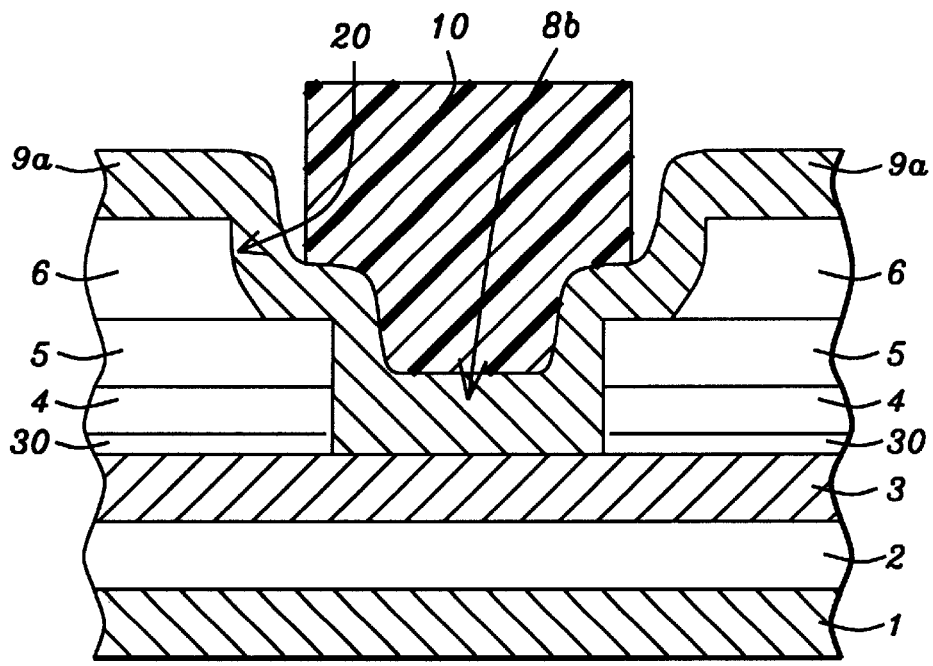
Figure 6:
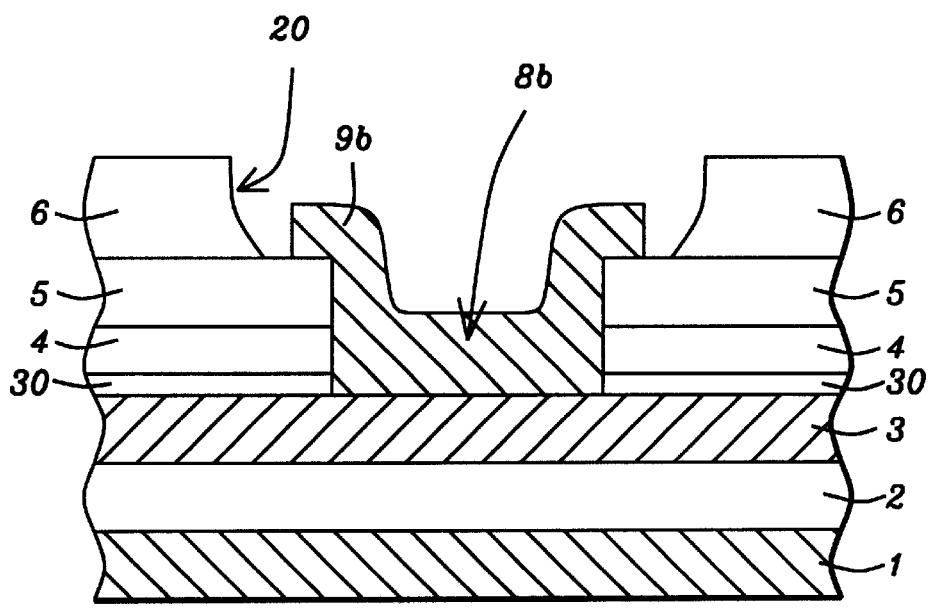

Photoresist shape 10, is next formed overlying regions of metal layer 9a, located entirely in bond pad opening 8b. The edges of photoresist shape 20, only extend to the portions of metal layer 9a, which overlay portions of silicon nitride layer 5, in lateral recessed region 20. This is schematically shown in FIG. 5. An anisotropic RIE procedure is next employed to define bond pad structure 9b, located entirely in bond pad opening 8b. The RIE procedure is performed using $Cl_2$ as an etchant for metal, or AlCu layer 9a, selectively terminating at the appearance of the top surface of silicon oxide layer 6, or silicon nitride layer 5. Photoresist shape 10, is then removed again via use of plasma oxygen ashing procedures. Bond pad structure 9b, shown schematically in FIG. 6, is now entirely located in bond pad opening 8b, and of greatest importance features a topography that will be protected from subsequent processes such as backside wafer thinning via a grounding procedure, as well as transportation operations employed to transfer the thinned semiconductor wafer to a dicing and bonding facility. The ability to laterally recess the top portion of the composite insulator stack, as well as depositing the bond pad metal layer at a thickness less than the thickness of the thick silicon oxide component of the composite insulator stack, allowed the objectives of locating bond pad structure entirely in bond pad opening 8b, and presenting a top surface topography below the top surface of the composite insulator stack, to be realized.

While this invention has been particularly shown and described with reference to, the preferred embodiments thereof, it will be understood by those skilled in the art that various changes in form and details may be made without departing from the spirit and scope of this invention.

What is claimed is:

1. A method of forming a bond pad structure on a semiconductor substrate, comprising the steps of:

forming an upper level metal interconnect structure, with said upper level metal interconnect structure communicating with active device regions in said semiconductor substrate;

forming a composite insulator stack on said upper level metal interconnect structure wherein said composite insulator stack is comprised of an underlying thin silicon nitride layer, an underlying silicon oxide layer, a silicon nitride layer, and an overlying silicon oxide layer;

forming a bond pad opening in said composite insulator stack exposing a portion of top surface of said upper level metal interconnect structure, with said bond pad opening featuring a laterally recessed, first opening in said overlying silicon oxide layer of said composite insulator stack, and featuring a second opening in bottom layers of said composite insulator stack, with said second opening narrower in width than said first opening in said composite insulator stack; and forming said bond pad structure in said bond pad opening, with a top surface of said bond pad structure located below a top surface of said composite insulator stack.

2. The method of claim 1, wherein said upper level metal interconnect structure is comprised of copper.

3. The method of claim 1, wherein said underlying silicon oxide layer of said composite insulator stack is obtained via PECVD or LPCVD procedures, at a thickness between about 3000 to 5000 Angstroms.

4. The method of claim 1, wherein said silicon nitride layer of said composite insulator stack is obtained via LPCVD or PECVD procedures, at a thickness between about 6000 to 8000 Angstroms.

5. The method of claim 1, wherein said overlying silicon oxide layer of said composite insulator stack is obtained via PECVD or LPCVD procedures, at a thickness between about 13,000 to 15,000 Angstroms, using tetraethylorthosilicate as a source.

6. The method of claim 1, wherein said laterally recessed, first opening in said overlying silicon oxide layer of said composite insulator stack, is formed via wet etch procedures using buffered hydrofluoric acid, or dilute hydrofluoric acid as a selective etch for silicon oxide.

7. The method of claim 1, wherein said laterally recessed, first opening in said overlying silicon oxide layer of said composite insulator stack, is formed via isotropic dry etching procedures using $CHF_3$ as a selective etch for silicon oxide.

8. The method of claim 1, wherein said second opening in said bottom layers of said composite insulator stack is defined via an anisotropic RIE procedure.

9. The method of claim 1, wherein the lateral recess of said first opening in said composite insulator stack is between about 12,000 to 14,000 Angstroms, resulting in second opening in said composite insulator stack narrower in width than said first opening in said composite insulator stack.

10. The method of claim 1, wherein said bond pad structure is comprised of aluminum—copper, with a weight percent of copper between about 0 to 2.

11. The method of claim 1, wherein thickness of said bond pad structure is between about 10,000 to 12,000 Angstroms.

12. A method of forming a bond pad structure in a bond pad opening, wherein said bond pad opening is in turn formed in a composite insulator stack, with the top surface of said bond pad structure lower than the top surface of said composite stack layer, comprising the steps of:

providing an upper level metal interconnect structure on a semiconductor substrate, with said upper level metal interconnect structure communicating with active device regions in said semiconductor substrate;

depositing a thin silicon nitride layer on said upper level metal interconnect structure;

depositing a first silicon oxide layer on said thin silicon nitride layer;

depositing a silicon nitride layer;

depositing a second silicon oxide layer;

defining a photoresist shape on said second silicon oxide layer;

performing an isotropic etch to define an isotropic, first opening in said second silicon oxide layer, forming a lateral recess in said second silicon oxide layer with said lateral recess located underlying said photoresist shape;

performing an anisotropic etch procedure using said photoresist shape as an etch mask to define a second opening in said silicon nitride layer in said first silicon oxide layer, and in said thin silicon nitride layer, resulting in said bond pad opening in said composite stack comprised of said isotropic, first opening in said second silicon oxide layer and comprised of said second opening in said silicon nitride layer, in said first silicon oxide layer, and in said thin silicon nitride layer, with said first opening wider than said second opening, and with said bond pad opening exposing a portion of a top surface of said upper level metal interconnect structure;

depositing a metal layer comprised with a thickness less than the thickness of said second silicon oxide layer; and patterning of said metal layer to define said bond pad structure located entirely in said bond pad opening, featuring a top surface of said bond pad structure located below the top surface of said second silicon oxide layer.

13. The method of claim 12, wherein said upper level metal interconnect structure is comprised of copper.

14. The method of claim 12, wherein said first silicon oxide layer is obtained via PECVD or LPCVD procedures, at a thickness between about 3000 to 5000 Angstroms.

15. The method of claim 12, wherein said silicon nitride layer is obtained via PECVD or LPCVD procedures, at a thickness between about 6000 to 8000 Angstroms.

16. The method of claim 12, wherein said second silicon oxide layer is deposited via PECVD or LPCVD procedures at a thickness between about 13,000 to 15,000 Angstroms, using tetraethylorthosilicate (TEOS), as a source.

17. The method of claim 12, wherein said isotropic etch used to define said first opening in said second silicon oxide layer, is performed using wet etch procedures via use of a buffered hydrofluoric acid or dilute hydrofluoric acid solution as an etchant.

18. The method of claim 12, wherein said isotropic etch used to define said first opening in said second silicon oxide layer, is performed using dry etch procedures using $CHF_3$ as an etchant.

19. The method of claim 12, wherein said lateral recess in said second silicon oxide layer located underlying said photoresist shape, is between about 12,000 to 14,000 Angstroms.

20. The method of claim 12, wherein said anisotropic dry etch procedure used to form said second opening for said bond pad opening, is performed using $CF_4$ or $Cl_2$ as an etchant for silicon nitride, and using $CHF_3$ as an etchant for silicon oxide.

21. The method of claim 12, wherein said metal layer is an aluminum—copper layer, obtained via plasma vapor deposition procedures, at a thickness between about 10,000 to 12,000 Angstroms.

22. The method of claim 12, wherein said metal layer is an aluminum—copper layer, comprised with a weight percent of copper between about 0 to 2.

23. The method of claim 12, wherein said bond pad structure is defined in said metal layer via an anisotropic RIE procedure, using $Cl_2$ as an etchant for said metal layer.

24. A bond pad structure on a semiconductor substrate, comprising:

a metal interconnect structure contacting active device regions in said semiconductor substrate, or with said metal interconnect structure contacting a lower level metal structure wherein said lower level metal structure in turn contacts said active device regions in said semiconductor substrate;

a bond pad opening in a composite insulator stack exposing a portion of top surface of said metal interconnect structure, wherein said composite insulator stack is comprised of a an underlying, thin silicon nitride layer, an underlying silicon oxide layer, a silicon nitride layer, and a thick, overlying silicon oxide layer, and wherein said bond pad opening features a first opening in said thick, overlying silicon oxide layer, and a second opening in said silicon nitride layer, in said underlying silicon oxide layer, and in said underlying thin silicon nitride layer, wherein said first opening is greater in width than said second opening; and said bond pad structure located entirely in said bond pad opening, contacting a portion of said metal interconnect structure exposed in said bond pad opening, and with a top surface of said bond pad structure lower than the top surface of said composite insulator stack.

25. The bond pad structure of claim 24, wherein said underlying silicon oxide layer, is comprised at a thickness between about 3000 to 5000 Angstroms.

26. The bond pad structure of claim 24, wherein the thickness of said silicon nitride layer of said composite insulator stack, is between about 6000 to 8000 Angstroms.

27. The bond pad structure of claim 24, wherein said thick, overlying silicon oxide layer of said composite insulator stack, is comprised at a thickness between about 3,000 to 15,000 Angstroms.

28. The bond pad structure of claim 24, wherein width of said first opening is between about 12,000 to 14,000 Angstroms, greater than the width of said second opening.

29. The bond pad structure of claim 24, wherein the thickness of said bond pad structure is between about 10,000 to 12,000 Angstroms.

30. The bond pad structure of claim 24, wherein said bond pad structure is comprised of aluminum—copper, with a weight percent of copper between about 0 to 2.

* * * * *